(12) United States Patent
Majidi et al.

(10) Patent No.: US 11,903,139 B2
(45) Date of Patent: Feb. 13, 2024

(54) HIGH-DENSITY SOFT-MATTER ELECTRONICS

(71) Applicant: CARNEGIE MELLON UNIVERSITY, Pittsburgh, PA (US)

(72) Inventors: Carmel Majidi, Pittsburgh, PA (US); Burak Ozdoganlar, Sewickley, PA (US); Arya Tabatabai, Pittsburgh, PA (US); Bulent Arda Gozen, Pittsburgh, PA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 0 days.

(21) Appl. No.: 17/181,756

(22) Filed: Feb. 22, 2021

(65) Prior Publication Data

US 2021/0204410 A1 Jul. 1, 2021

Related U.S. Application Data

(62) Division of application No. 15/019,786, filed on Feb. 9, 2016, now Pat. No. 10,945,339.

(Continued)

(51) Int. Cl.
*H05K 3/10* (2006.01)
*H05K 1/02* (2006.01)
(Continued)

(52) U.S. Cl.
CPC ........... *H05K 3/107* (2013.01); *G03F 7/0002* (2013.01); *H05K 1/0283* (2013.01); *B81C 2201/0156* (2013.01); *B81C 2201/0159* (2013.01); *H05K 1/162* (2013.01); *H05K 3/281* (2013.01); *H05K 2201/0162* (2013.01); *H05K 2201/10015* (2013.01); *H05K 2203/0108* (2013.01); *H05K 2203/0156* (2013.01)

(58) Field of Classification Search
CPC .......... H05K 1/0283; B81C 2201/0159; H01G 4/002; H01G 4/30
See application file for complete search history.

(56) References Cited

U.S. PATENT DOCUMENTS

2012/0118066 A1* 5/2012 Majidi .................... G01L 1/205
73/719

FOREIGN PATENT DOCUMENTS

WO 2013/044226 * 3/2013

OTHER PUBLICATIONS

Andrew Fassler et al, Lab on a Chip (2013), 13, 4442-4450, here after Fassler. (Year: 2013).*

* cited by examiner

*Primary Examiner* — Tabassom Tadayyon Eslami
(74) *Attorney, Agent, or Firm* — Michael G. Monyok (57) ABSTRACT

The disclosure describes a soft-matter electronic device having micron-scale features, and methods to fabricate the electronic device. In some embodiments, the device comprises an elastomer mold having microchannels, which are filled with an eutectic alloy to create an electrically conductive element. The microchannels are sealed with a polymer to prevent the alloy from escaping the microchannels. In some embodiments, the alloy is drawn into the microchannels using a micro-transfer printing technique. Additionally, the molds can be created using soft-lithography or other fabrication techniques. The method described herein allows creation of micron-scale circuit features with a line width and spacing that is an order-of-magnitude smaller than those previously demonstrated.

12 Claims, 8 Drawing Sheets

Related U.S. Application Data (60) Provisional application No. 62/176,107, filed on Feb. 9, 2015.

(51) Int. Cl.
*G03F 7/00* (2006.01)
*H05K 3/28* (2006.01)
*H05K 1/16* (2006.01)

$C_{AB} = 0.2$ pF
$R_{AB} = 3$ M$\Omega$
Quality Factor= 50

$C_{AB} = 0.07$ pF
$R_{AB} = 3$ M$\Omega$
Quality Factor= 50

FIG. 8

HIGH-DENSITY SOFT-MATTER ELECTRONICS

CROSS-REFERENCE TO RELATED APPLICATIONS

This application is a divisional of U.S. Nonprovisional application Ser. No. 15/019,786 filed Feb. 9, 2016, which claims the benefit under 35 U.S.C. § 119 of U.S. Provisional Application Ser. No. 62/176,107, filed Feb. 9, 2015, each of which is incorporated by reference herein in its entirety.

STATEMENT REGARDING FEDERALLY SPONSORED RESEARCH

Not applicable.

BACKGROUND OF THE INVENTION

This invention relates to soft-matter electronics. More particularly, this invention relates to soft-matter electronic devices with micron-scale circuit feature sizes, and methods of fabricating such electronic devices.

Soft-matter electronics have a range of applications, from personal computing, assistive medical robotics, and other application domains that require safe and comfortable human-machine interaction. In one example, soft-matter electronics are incorporated into wearable electronics, which are electronic devices designed to be worn by a user in close contact with their body. To allow body parts to move freely, wearable electronics must be intrinsically soft and stretchable in order to match the elastic compliance of natural human tissue. In the past, materials such as conductive fabrics and meandering wires have been used to allow movement. More recently, "soft-matter" electrical wires composed entirely of soft elastomers, gels, and fluids have been used. In these soft microfluidic electronics, a fluidic channel of liquid alloy embedded in an elastomer functions as an electrically conductive wire that remains conductive as the surrounding elastomer is stretched.

In some soft-matter electronics, a eutectic Gallium-Indium (EGaIn) metal alloy is used as the conductive material. The EGaIn traces are liquid at room temperature, and thus, they remain intact and electrically functional as the surrounding elastomer elastically deforms during stretching and bending. Since the alloy is a liquid at room temperature (above about 5° C. or higher), the alloy is sealed within microchannels formed in an elastomer to prevent the alloy from escaping.

Soft-matter electronics offer many advantages to enable electronic devices to be conformable in various applications since they remain mechanically intact and electrically functional under extreme elastic deformation. For instance, the intrinsic elasticity enables compliance matching with human tissue and allows soft-matter electronics to complement metal-coated textiles, wavy circuits, and other elastically-deformable technologies that can be worn on the skin or implanted in the body without interfering with natural bodily functions. Fabrication and functionality of several soft-matter electronic devices have been demonstrated including antennas, complex circuit components, and strain, force, and pressure sensors.

Previous fabrication methods have included mask stencil lithography, droplet-based transfer microcontact printing (µCP), freeze-casting, laser engraving, and deposition with a motorized capillary. However, the aforementioned patterning techniques have only been used to produce circuits with feature sizes greater than 30 µm. The main limitation of previous techniques is that they generally involve injection of liquid alloys under pressure into microchannels or onto target elastomeric surfaces. Creation of single-micron scale structures requires very high pressures that can exceed the elastic modulus of the elastomer and lead to mechanical failure.

Stated differently, soft and stretchable microelectronics with micron-scale line widths that will enable the circuit density and sophisticated functionality of conventional rigid microelectronics have not been demonstrated using previously known techniques. Therefore, it would be advantageous to develop a method that allows fabrication of soft-matter electronics with feature sizes approaching those of traditional rigid microelectronics.

BRIEF SUMMARY OF THE INVENTION

According to embodiments of the present invention are soft-matter electronics with micron-scale features, and methods to fabricate such electronics. In one embodiment, microchannels are created in an elastomer using soft-lithography and replica molding techniques. Subsequently, micro-transfer printing is used to fill a eutectic alloy into the microchannels, which are then sealed with another layer of elastomer. The method of the present invention allows fabrication of micron-scale circuit features with a line width and spacing that is an order-of-magnitude smaller than those previously demonstrated.

DETAILED DESCRIPTION OF THE INVENTION

According to embodiments of the present invention is a soft-matter electronic device 300 and methods of fabricating the electronic device 300. Soft-matter electronics maintain conductive functionality while being stretched and deformed. In contrast to conventional microelectronics, these circuits are composed of a soft elastomer package comprising microfluidic channels 301 filled with eutectic metal alloy 302, such as a Gallium-Indium alloy (EGaIn). Eutectic metal alloys 302, such as EGaIn, are liquid at room temperature, and thus, they remain intact and electrically functional as the surrounding elastomer elastically deforms during stretching and bending.

In addition to alloys such as EGaIn, the soft matter electronic device 300 can use other eutectic alloys such as Galinstan® (Gallium-Indium-Tin), NewMerc®, Indalloy®, and similar alloys of Gallium and Indium, as these alloys offer a non-toxic alternative to mercury and are liquid near room temperature. In addition, these alloys are particularly attractive for their high electrical conductivity, which is about $1/20^{th}$ the conductivity of copper and is orders of magnitude greater than conductive grease and electrolytic solutions.

The fabrication method, according to one embodiment, uses techniques in soft lithography and micro-transfer printing. Soft lithography is used to create a master mold or template 201 of the circuit 305, which can be used to create an elastomer mold 303 comprising a plurality of microchannels 301 replicating the circuit 305. Micro-transfer printing is used to transfer the alloy 302 into the microchannels 301 of the elastomer mold 303. While this particular embodiment relies upon soft lithography to create the template 201, alternate embodiments use different fabrication techniques.

Figure 1:
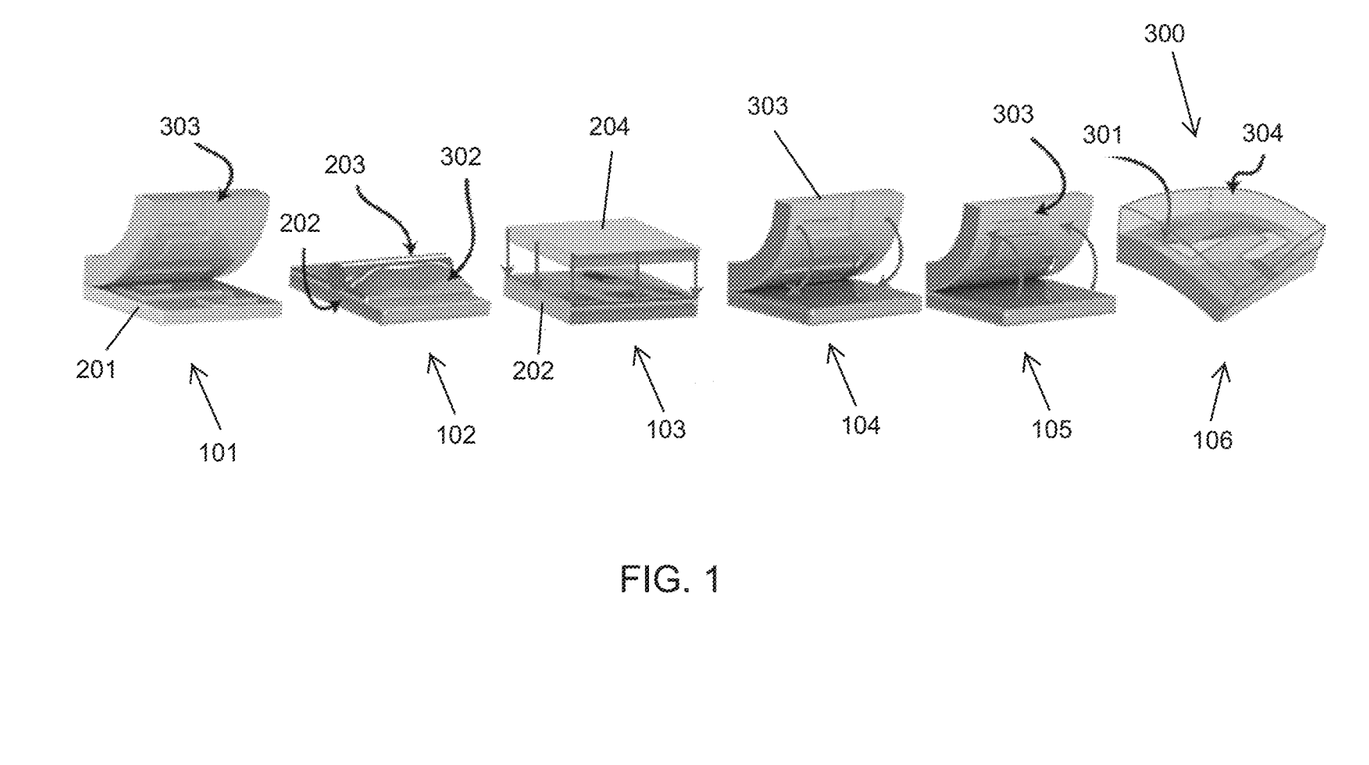
FIG. 1 illustrates the various steps of fabricating a soft-matter electronic device according to one embodiment.

Referring to FIGS. 1, at step 101 an elastomer mold 303 with micron-scale concave features (i.e., microchannels 301) is created through elastomer replica molding. In this embodiment, soft lithography is used to create the master mold (or template) 201, on which the microchannels 301 are positive features rising above the surface of the master mold 201. In turn, the template 201 is used to create the elastomer mold 303, where the microchannels 301 are depressions on the surface of the elastomer. In alternative embodiments, other methods can be used to create the elastomer mold 303, including but not limited to direct patterning of elastomers through focused-ion beam lithography, electron-beam lithography, or micro-scale 3D printing of the elastomeric mold. In this configuration described above, the elastomer mold is polydimethylsiloxane (PDMS), but other elastomers such as UV-curable polyurethanes (PU) and derivatives of polyvinyl siloxanes (PVS), among others, can be used.

At step 102, the liquid-phase eutectic alloy 302, such as EGain, is deposited as a thin film across an elastomeric "donor" substrate 202. In one embodiment, the donor substrate 202 is created by curing an elastomer against a flat silicon wafer. As shown in FIG. 1, the alloy 302 is spread with a roller 203. At step 103, the deposited alloy 302 is flattened by compression using a flat elastomeric substrate 204 under normal force. In one configuration, the film is about a few nanometers to several microns thick. While this particular method describes a two-step process using a roller 203 and flattening substrate 204, alternative methods that create a substantially uniform film on the surface of the donor substrate 202 can be used.

Subsequently, enabled by the unique wetting properties of the alloy 302 in air, micro-transfer printing is used to fill the microchannels 301 with alloy 302 at step 104. During step 104, the mold 303 is pressed onto the donor surface 202, which contains a thin film of the alloy 302 on its surface. When the elastomer mold 303 is separated from the donor substrate 202 at step 105, the channels 301 remain filled with alloy 301. At step 106, the microchannels are sealed with another layer 304 of elastomer, such as PDMS.

Figure 2:
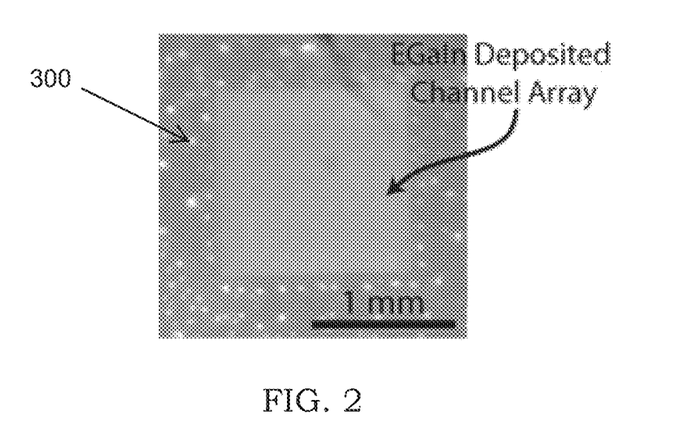
FIG. 2 is a stereo microscope image of an array with a eutectic alloy deposited in channels of the array.
Figure 3A:
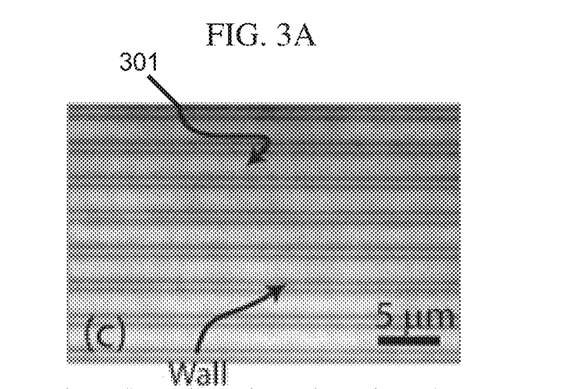
FIG. 3A is a stereo microscope image of an array prior to deposition.
Figure 3B:
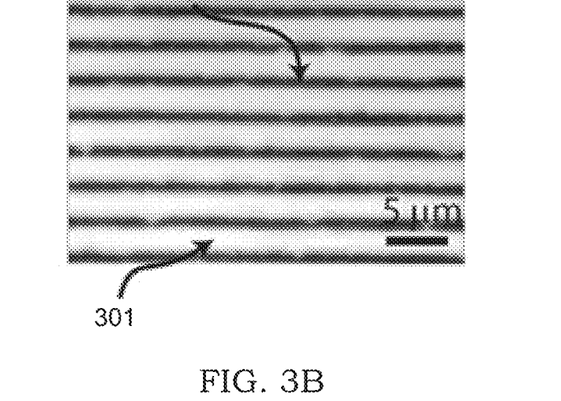
FIG. 3B is a stereo image of an array after deposition of the eutectic alloy.

This versatile fabrication technique can be used to pattern a eutectic alloy 302 into any planar network of microfluidic channels 301 that can be formed on an elastomer mold 303. As an example of this method of fabrication, FIG. 2 shows micro-patterned EGaIn over a large ($mm^2$) surface area. In this embodiment, a PDMS mold 303 is patterned with arrays of channels 301 having a nominal depth of 1 μm and length of 1.5 mm. Three different channel-width and inter-channel spacing combinations were included on the mold 303: 10 μm width with 10 μm spacing; 5 μm width with 5 μm spacing; and 2 μm width with 1 μm spacing. PDMS is used as the donor substrate 202 and EGain is used as the alloy 302. Light intensity maps acquired from optical profilometry of the 2 μm wide channels are shown in FIG. 3A (before EGain deposition) and in FIG. 3B (after EGaIn deposition). In these figures, EGaIn filled channels 301 are recognized by higher light intensity (lighter color in the drawing).

In this exemplar embodiment, the elastomer mold 303 is fabricated by a two-step replica molding process. In the first step, a template 201 is created using an AFM step height standard including thermally grown silicon dioxide features on a silicon substrate (for example, AppNano SHS-1) as a guide. An AFM step height standard can contain grating with a pitch of 3 μm, for example, making it suitable for defining the single micron-wide microchannels 301. Using the step height standard as a guide, a UV-curable polymer (for example, Norland Adhesives NOA-63) is applied to the standard to create its reverse replica. For this purpose, the liquid polymer precursor is applied on the guide and cured using a UV light source, such as a Black Ray UV-light, 365 nm wavelength) at 21.750 $mW·cm^{-2}$.

The polymer production mold 201 created from the height standard is then molded by a two part PDMS (for example, Slygard 184 Dow Corning, 10:1 mass ratio) to produce an elastomer mold 303 containing microchannels 301. A PDMS donor substrate 202 is created by a curing two-part PDMS against a flat silicon wafer using a larger mass ratio (15:1), which can improve wettability by EGaIn compared to 10:1 mass ratio. In this example, a droplet of EGaIn is then introduced on the donor substrate 202 using a syringe and manipulated to form a smooth (40 nm Ra characterized by optical profilometry), thin film. Both the roller 203 and the flat elastomer substrate 204 used to spread and flatten the EGaIn film are made of PDMS (10:1 mass ratio).

To accurately place the elastomer mold 303 against the thin film, the elastomer mold 303 is glued to a glass slide and then attached to a motorized vertical stage (ThorLabs MTS/50-Z8, for example) which is used to establish controllable contact between the mold 303 and the EGaIn film. The donor substrate 202 is attached to a kinematic mount (ThorLabs K6XS, for example), which enables making angular alignments between the mold 303 and donor substrate 202. The EGaIn deposited mold 303 is then sealed through polymerization of the sealing PDMS layer 304 (10:1 mass ratio) on the mold 303. All PDMS samples are polymerized at 50° C. for 8 hours.

Figure 4A:
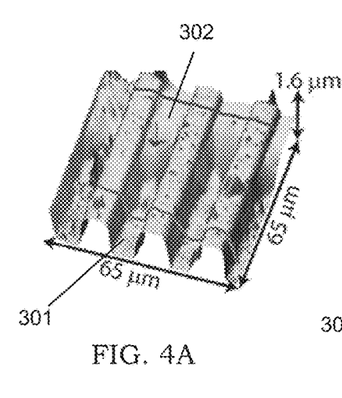
FIGS. 4A-4C are three dimensional atomic force microscope images of partially emptied channels having widths of 10 µm, 5 µm, and 2 µm, respectively.
Figures 4B, 4C:
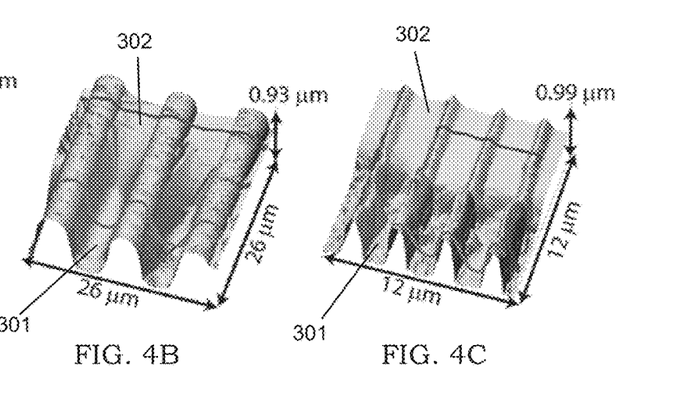

FIGS. 4A, 4B, and 4C show atomic force microscopy (AFM) images of different sections of the soft matter electronic device 300 created by the foregoing example fabrication method. The deposited EGain patterns in the device 300 were locally and selectively damaged prior to sealing using a sharp tungsten probe with sub-micron tip radii. The regions that include the interface between the damaged and undamaged EGaIn patterns are shown in FIGS. 4A-4C.

Figure 5A:
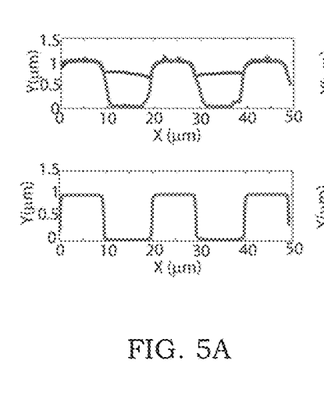
FIGS. 5A-5C are graphs depicting cross-sectional atomic force microscope data from the filled and emptied sections of the channels (top row) and cross-sectional atomic force microscope profiles of the channels prior to deposition with Gallium-Indium alloy (bottom row), corresponding to channels having widths of 10 µm, 5 µm, 2 µm, respectively.
Figure 5B:
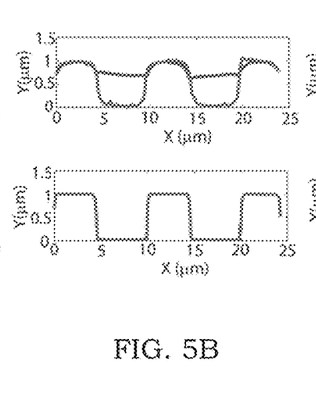
Figure 5C:
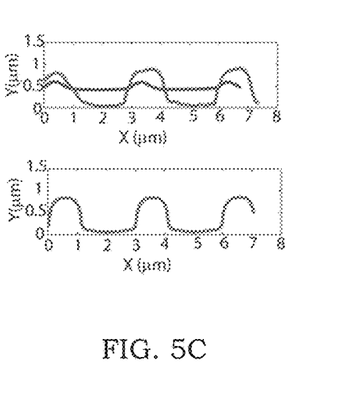

Cross-sectional profiles of the channels 301 prior to EGaIn deposition are shown in the bottom row of FIGS. 5A-5C for line widths of 10 µm, 5 µm, and 2 µm, respectively. The top row of FIGS. 5A-5C show the profile of alloy 302 deposited within the microchannels 301. As shown, the channels 301 are partially filled, forming "wires" of EGaIn along the length of the channels 301. Furthermore, a thin residual layer of EGaIn can be observed outside the channels 301. This residual layer causes deformation of the sidewalls of the channels 301, particularly for the arrays with 1 µm spacing (FIG. 5C). For channel arrays with larger spacing, periodic textures were observed on the sidewalls. The AFM measurements suggest that the thickness of the residual layer is approximately 10 nm.

Figure 6A:
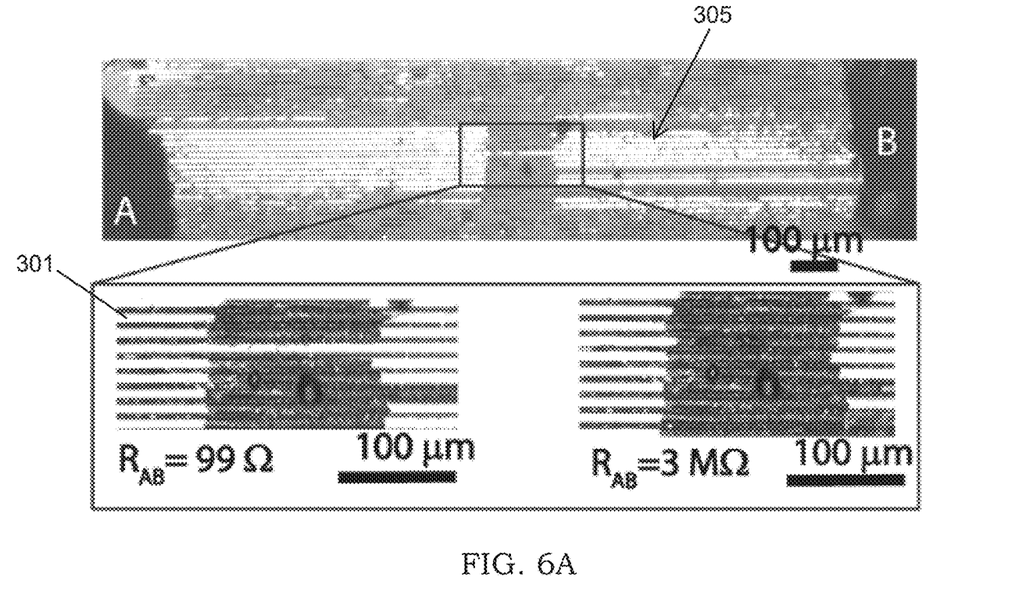
FIGS. 6A and 6B are microscope images of wire arrays with line widths of 5 µm (FIG. 6A) and 2 µm (FIG. 6B).
Figure 6B:
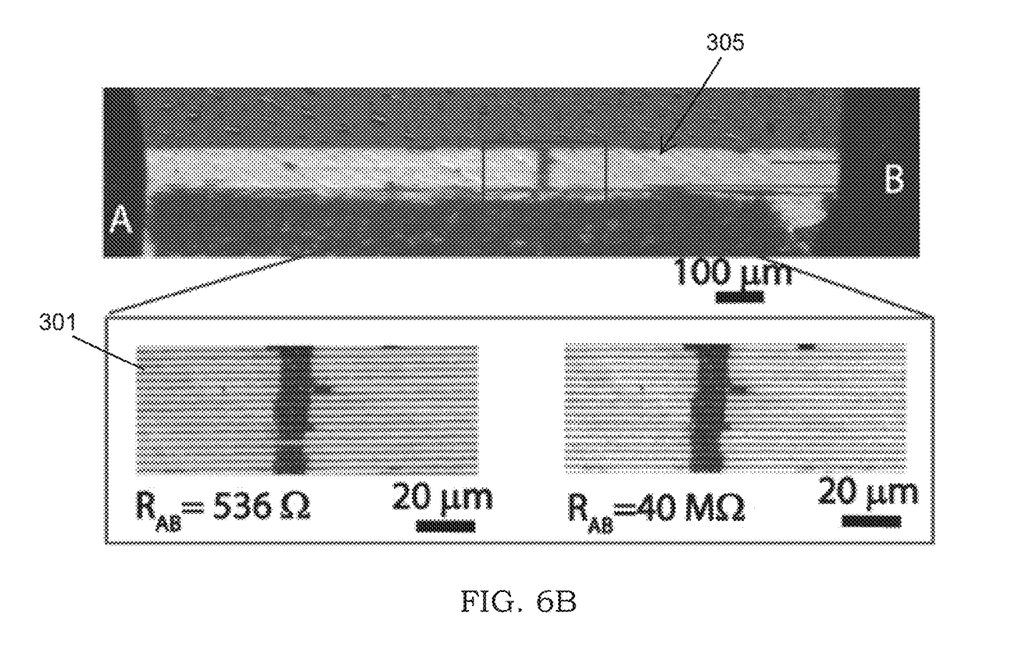

Referring to FIGS. 6A and 6B, conductivity measurements were performed on 5 µm and 2 µm wide wires to study the electrical characteristics of the circuit 305 created by the patterned alloy 302. As shown in FIGS. 6A-6B, tungsten probes were inserted into two large droplets of EGaIn administered at the end of the wires prior to sealing. During the measurements, the inherent resistance of the measurement loop (resistance of the probes, contact resistance between the probes and the droplets etc.) were quantified and subtracted from the measured resistance. To correlate the resistance values with the number of EGaIn wires, a sequential approach was used: the resistance was first measured for the largest number of wires. For each of the following measurements, one wire was severed using the tungsten probe before each measurement. Approximately six orders of magnitude increase in the measured resistance was observed after the disconnecting all the wires for both of the cases.

To compare the conductivity of the created circuits with the bulk conductivity of EGaIn, the measured resistance values were compared with values that were predicted using Ohm's Law. The predicted resistance values were calculated as $$R = \left(\sum_{i=1}^{n} \frac{1}{R_i}\right)^{-1}, \quad (1)$$

where n is the number of the wires connected in parallel and $R_i$ is the individual resistances of the measured wires given by $$R_i = \rho \int_0^L \frac{dx}{A_i(x)}. \quad (2)$$

Figure 7:
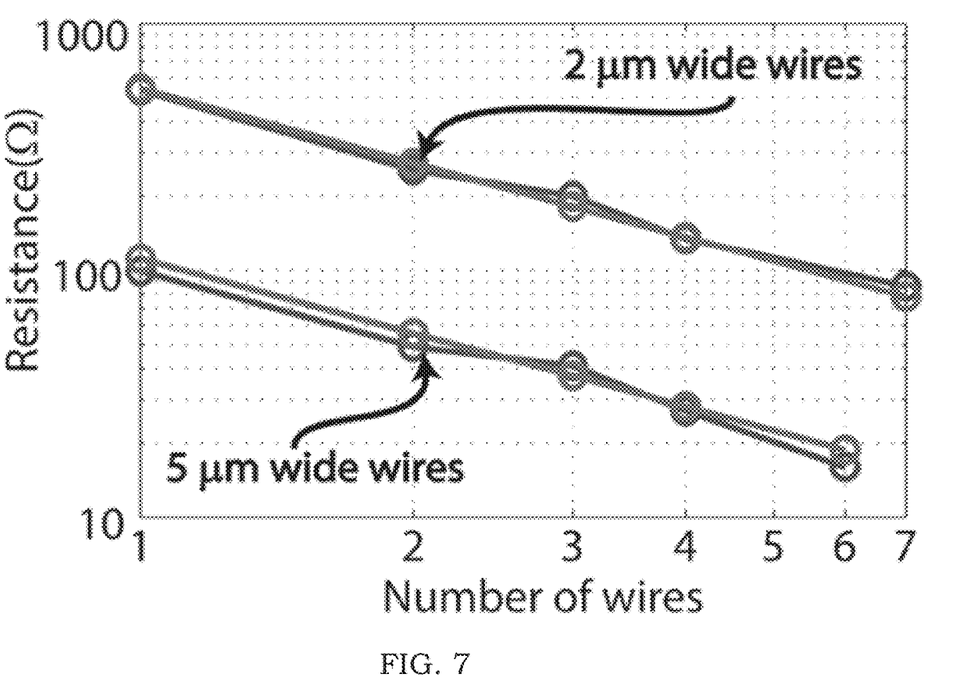
FIG. 7 is a graph showing measured values and Ohm's Law-based predictions for the resistances of 5 µm and 2 µm wide wires for different number of wires connected in parallel.

Here, ρ is the bulk resistivity of EGaIn (29.4×10⁻⁶ Ωcm), x is the coordinate along the length of a wires, L is the total length of the wire, and $A_i(x)$ is the cross-sectional area of the wire at an arbitrary location along the length of the wire. To determine $A_i(x)$, optical profilometry measurements of the wires both before and after they were disconnected were performed. Assuming that the channels 301 were filled entirely below the measured top surface, the cross-sectional area at a given location was calculated by integrating the difference between the filled and emptied cross-sections of the channels 301. As shown in FIG. 7, the measured and predicted resistance values show a strong agreement for both channel 301 sizes.

A number of critical conclusions can be drawn from the results of the conductivity testing and the agreement between the measured values of wire resistances and the predictions based on Ohm's Law: (1) the microchannels 301 exhibit the same level of electrical conductivity as bulk EGaIn alloy 302; (2) a strong agreement between the predicted and measured resistances for multiple parallel microchannels 301 and, the multiple orders of magnitude increase in resistance after disconnecting all of the wires formed by the microchannels 301 indicate that the wires are not shorting across the inter-wire spacing, which can be as small as 1 µm with the method of the present invention (the results signifies that the residual layer between the channels 301 consists of non-conductive oxides of the alloy 302); and (3) the channels 301 on the elastomer mold 303 are completely filled below the surface of the deposited alloy 302.

Figure 8:
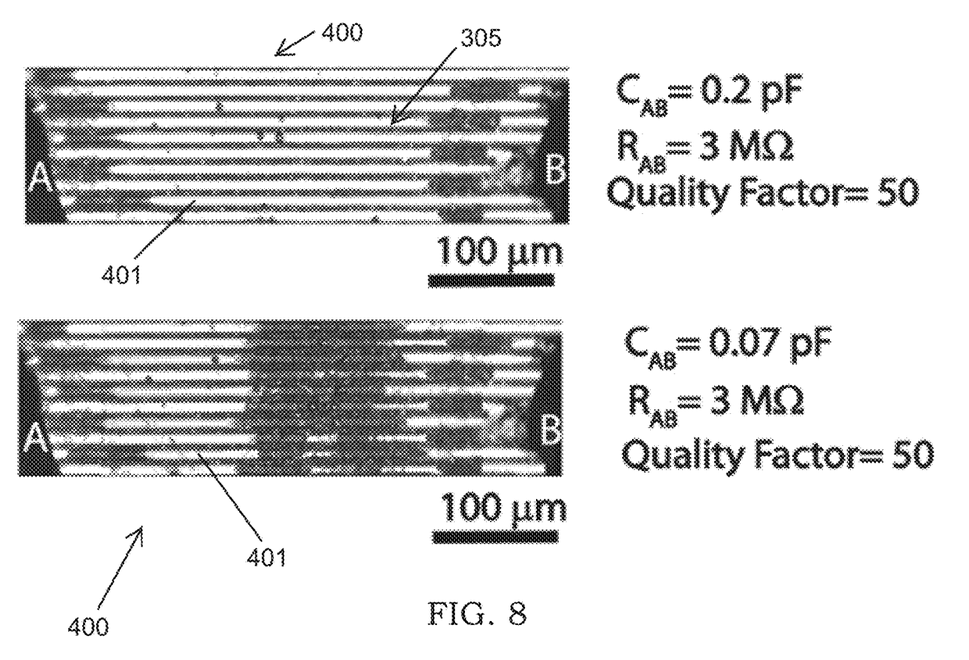
FIG. 8 shows microscope images of the interdigital co-planar capacitor created through local disconnection of the 5 µm wide wires and associated capacitance measurements.

FIG. 8 shows an example of a functional circuit element 305—a co-plane capacitor—that can be created using the method of the present invention. In this example, a capacitor 400 comprises 5 µm wide microchannels 301 with 5 µm spacing, which are selectively disconnected to form a comb pattern with a total of ten fingers 401. The capacitance measurement across the capacitor 400 is 0.2 pF, as shown in the top image of FIG. 8. To quantify any parasitic capacitive effect (e.g., those due to the applied droplets or the residual layer), another capacitance measurement was performed after disconnecting all the fingers 401, as shown in the bottom image of FIG. 8 as 0.07 pF. Assuming a parallel electrical connection between the co-planar capacitance of the created circuit 305 and the parasitic capacitance, the effective capacitance of the EGaIn-based capacitor 400 is 0.13 pF.

The total surface area within which the measured capacitance is achieved is approximately 2×10⁻⁸ m², yielding a density of capacitance over the planar area as high as 6.5 µF/m². This is significantly higher than the ~10 nF/m² capacitance density previously achieved with EGaIn-based soft-matter electronics. Stated differently, the method and device 300 of the present invention exhibits a 650× increase in capacitance density compared to EGaIn-based circuits previously produced with needle injection techniques. As this example illustrates, the smaller channel 301 width allows the creation of circuits 305 with greater functionality compared to devices created with prior methods. As a person having skill in the art will appreciate, feature size can be a critical factor in designing a device. For example, smaller feature size reduces the distance signals propagate through the circuit 305, lowers parasitic capacitance, and can allow the use of lower voltage.

A capacitor is just one example of a circuit 305 that can be created using the method of the present invention. The method can be used to create additional circuits 305, such as a strain gauge, pressure gauge, force gauge, antenna, connective wires, or other devices utilizing electromechanical functionalities.

Figure 9A:
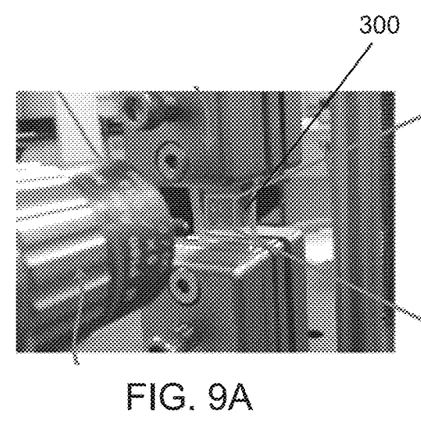
FIGS. 9A-9D show the experimental setup for mechanical testing of wires fabricated according to one embodiment of the present invention (FIG. 9A) and stereo-microscope images of the wire array and its interfacing with the alloy droplets (FIGS. 9B-9D).
Figure 9B:
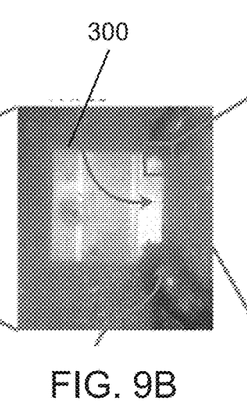
Figure 9C:
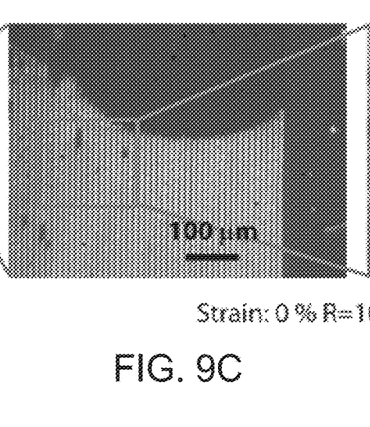
Figure 9D:
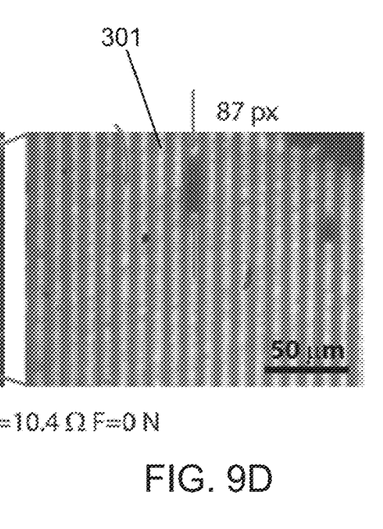

One of the key requirements for soft-matter electronics is for them to maintain their electronic functionality during elastic deformation. FIG. 9A depicts an axial loading test on a sample soft-matter electronic device 300 having 5 µm wide microchannels 301. For this purpose, the sealed elastomeric mold 303 was clamped at its two ends in a vertical configuration as shown in FIG. 9A. In this configuration, the bottom clamp was kept stationary, whereas the top clamp was moved vertically, thereby stretching the mold 303. During stretching, the EGaIn-filled microchannels 301 were observed using a microscope through the transparent sealing layer 304. The axial force on the top clamp was measured using a force gauge. To enable conductivity measurements during the mechanical testing, alloy droplets were administered at both ends of the microchannels 301 prior to sealing (as shown in FIG. 9B), and copper wires were embedded inside the droplets and the sealing layer 304. The magnified microscope images of the EGaIn-filled microchannels 301 at various axial strain levels along with the measured axial force and resistance values are shown in FIGS. 9C-9D and FIGS. 10A-10D. As shown, the test was extended up to 40% axial strain. No visual degradation of the integrity of the EGain-filled microchannels 301 is observed up to 40% axial strain.

Figure 10A:
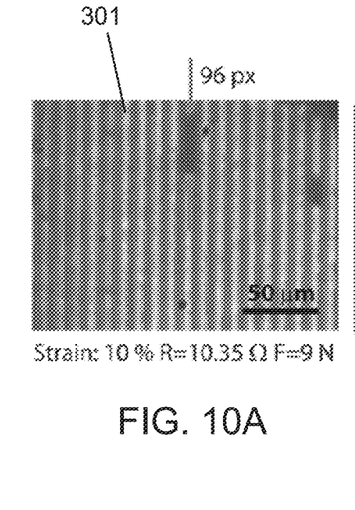
FIGS. 10A-10D are magnified microscope images of the 5 µm wide wire arrays at various strain levels.
Figure 10B:
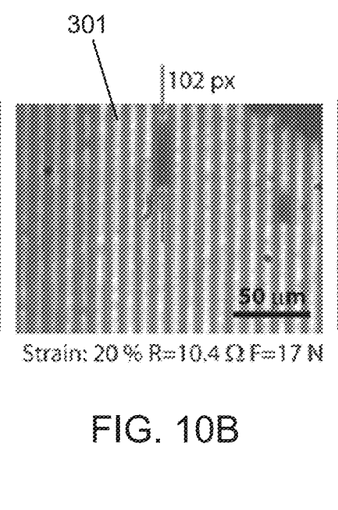
Figure 10C:
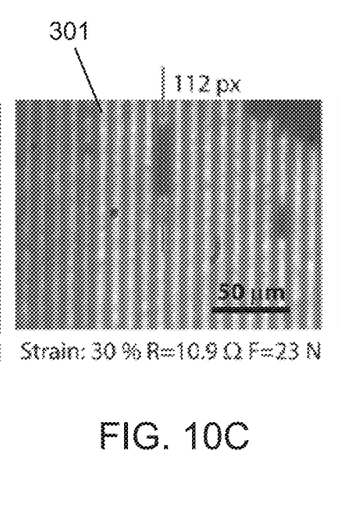
Figure 10D:
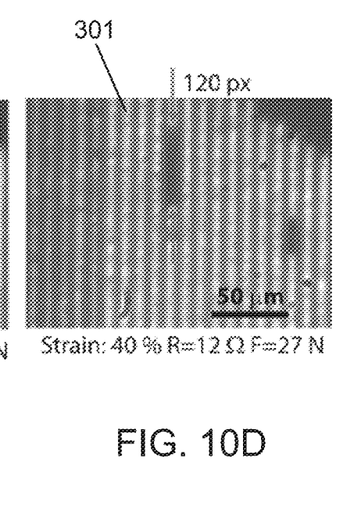

As shown in the figures, the resistance across the microchannels 301 is 10.4Ω with zero strain (FIG. 9D), 10.35Ω at 10% strain (FIG. 10A), 10.4Ω at 20% strain (FIG. 10B), 10.9Ω at 30% strain (FIG. 10C), and 12Ω at 40% strain (FIG. 10D). In summary, the resistance at 40% strain increased less than 20% of the unstrained value. The resistance values indicated above are not compensated for the resistance of the measurement loop.

The resistance corresponding to the wires should be approximately 3Ω and thus, the measurement loop resistance should be approximately 7Ω. Considering the mechanical properties of PDMS (Poisson's ratio ~0.5), it is expected for the EGain-filled microchannels 301 resistance to increase quadratically with the amount of stretch (1+strain). Accordingly, a measured resistance change of less than 2Ω is reasonable. After the testing was complete and the mold 303 was taken out of the clamps, the resistance across the wires was measured to be 10.6Ω indicating that no apparent loss in conductivity occurred upon relaxation of the strain.

While the disclosure has been described in detail and with reference to specific embodiments thereof, it will be apparent to one skilled in the art that various changes and modification can be made therein without departing from the spirit and scope of the embodiments. Thus, it is intended that the present disclosure cover the modifications and variations of this disclosure provided they come within the scope of the appended claims and their equivalents.

What is claimed is:

1. A soft-matter electronic device, comprising:
    an elastomer mold comprising a surface and a depression on the surface,
        wherein the depression forms a plurality of microchannels in a shape of an electronic circuit;
    a eutectic alloy disposed within the plurality of microchannels,
        wherein a layer of non-conductive oxide is disposed on the surface of the elastomer mold outside of the plurality of microchannels,
        wherein the eutectic alloy is only present within the plurality of microchannels to form the electronic circuit; and
    a barrier covering the microchannels and the layer of non-conductive oxide.

2. The soft-matter electronic device of claim 1, wherein the plurality of microchannels have a width of less than 30 μm.

3. The soft-matter electronic device of claim 1, wherein a spacing between adjacent microchannels is about 1 μm to 10 μm.

4. The soft-matter electronic device of claim 1, wherein the spacing between adjacent microchannels is about 1 μm.

5. The soft-matter electronic device of claim 1, wherein the plurality of microchannels have a width from about 2 μm to 30 μm.

6. The soft-matter electronic device of claim 1, wherein the electronic circuit comprises a capacitor having a plurality of fingers forming a comb pattern.

7. The soft-matter electronic device of claim 6, wherein a density of capacitance of the capacitor is at least 6.5 μF/m$^2$.

8. The soft-matter electronic device of claim 6, wherein a density of capacitance of the capacitor is greater than 10 nF/m$^2$.

9. The soft-matter electronic device of claim 1, wherein the electronic circuit remains conductive when the elastomer mold is stretched by up to about 40% of an initial state.

10. The soft-matter electronic device of claim 1, wherein the elastomer mold is polydimethylsiloxane.

11. The soft-matter electronic device of claim 1, wherein the eutectic alloy comprises an alloy of Gallium and Indium.

12. A soft-matter electronic device created by a molding process, the molding process comprising:
    creating an elastomer mold containing a plurality of microchannels forming an electronic circuit, wherein each microchannel of the plurality of microchannels comprises a depression in a surface of the elastomer mold;
    depositing a thin film of a liquid-phase eutectic alloy on a donor surface;
    mating the elastomer mold onto the donor surface to transfer the thin film to the mold,
        wherein the liquid-phase eutectic alloy is drawn into the plurality of microchannels via contact with the thin film, wherein the liquid-phase eutectic alloy is only present within the plurality of microchannels,
        wherein a residual layer of non-conductive alloy oxide forms on the mold between the plurality of microchannels, wherein the residual layer is outside of the plurality of microchannels;
    separating the elastomer mold from the donor surface, wherein the liquid-phase eutectic alloy remains in the plurality of microchannels of the elastomer mold;
    sealing the plurality of microchannels of the elastomer mold containing the liquid-phase eutectic alloy and the residual layer with an elastomer to form the soft-matter electronic device.

* * * * *